(12) United States Patent
Suzuki et al.

(10) Patent No.: US 7,128,524 B2
(45) Date of Patent: Oct. 31, 2006

(54) VENTILATING STRUCTURE AND MOUNTING STRUCTURE FOR ELECTRONIC APPARATUS

(75) Inventors: Kazumasa Suzuki, Hamamatsu (JP); Kiyohiko Goto, Hamamatsu (JP)

(73) Assignee: Yamaha Corporation, Hamamatsu (JP)

( * ) Notice: Subject to any disclaimer, the term of this patent is extended or adjusted under 35 U.S.C. 154(b) by 0 days.

(21) Appl. No.: 10/967,576

(22) Filed: Oct. 18, 2004

(65) Prior Publication Data

US 2005/0046802 A1    Mar. 3, 2005

Related U.S. Application Data

(62) Division of application No. 10/076,801, filed on Nov. 13, 2001, now Pat. No. 6,840,629.

(30) Foreign Application Priority Data

| Nov. 14, 2000 | (JP) | ............................. 2000-347162 |
| Nov. 14, 2000 | (JP) | ............................. 2000-347163 |
| Nov. 14, 2000 | (JP) | ............................. 2000-347164 |

(51) Int. Cl.
*F01D 5/10* (2006.01)
*F01D 25/04* (2006.01)
*F03D 11/04* (2006.01)

(52) U.S. Cl. .................... 415/119; 415/213.1

(58) Field of Classification Search ................ 415/119, 415/204, 206, 213.1, 214.1; 248/560, 562, 248/634

See application file for complete search history.

(56) References Cited

U.S. PATENT DOCUMENTS

| 257,860 | A | * | 5/1882 | Shaprio ........................ 86/37 |
| 5,448,645 | A | | 9/1995 | Guerci |
| 5,806,952 | A | | 9/1998 | Fujimori |
| 5,860,719 | A | | 1/1999 | Suzuki |
| 6,428,170 | B1 | | 8/2002 | Haba |
| 6,471,357 | B1 | | 10/2002 | Hara et al. |
| 6,488,378 | B1 | | 12/2002 | Tabuchi et al. |
| 6,513,936 | B1 | | 2/2003 | Ishiwa et al. |
| 6,558,003 | B1 | | 5/2003 | Mihara |
| 6,568,813 | B1 | | 5/2003 | Haba et al. |

FOREIGN PATENT DOCUMENTS

JP            11241489 A    *    9/1999

* cited by examiner

*Primary Examiner*—Edward K. Look
*Assistant Examiner*—Dwayne J White
(74) *Attorney, Agent, or Firm*—Pillsbury Winthrop Shaw Pittman LLP (57) ABSTRACT

An electronic apparatus is housed in a dual housing structure that includes an inner case housing electronics and an outer case surrounding the inner case. The inner and outer cases have respective intake openings and are spaced from each other by a sufficient distance such that an intake chamber is defined therebetween. A fan unit is provided, for discharging exhaust air from within the apparatus, and a silencer is provided, for silencing the exhaust air discharged via the fan unit. Mounting portions are formed on the front and rear surfaces of the fan unit and are attached to a fan case via gel-state shock absorbers.

4 Claims, 5 Drawing Sheets

VENTILATING STRUCTURE AND MOUNTING STRUCTURE FOR ELECTRONIC APPARATUS

RELATED APPLICATION

This application is a divisional application of application Ser. No. 10/076,801, filed Nov. 13, 2001, now U.S. Pat. No. 6,840,629.

BACKGROUND OF THE INVENTION

The present invention relates to ventilating structures for use in electronic apparatus such as video projectors. The present invention also relates to ventilating structures for use in video projectors having a projecting lens in their front end section. The present invention also relates to structures for mounting a ventilating fan unit for use in electronic apparatus such as video projectors.

In homes and offices, video projectors are being popularly used for projecting video images on a screen. Generally, each of the video projectors includes a built-in light source of great light quantity for projecting video images on a large screen. For example, the light source is in the form of an incandescent lamp that consumes electric power in the order of 150 watts. Electronic circuitry for processing video signals in the video projector also consumes electric power more than 50 watts and thus the video projector as a whole consumes power exceeding 200 watts, so that a considerable amount of heat is generated in the interior of the video projector. Because sufficient heat dissipation is not attainable by natural ventilation, an electric fan is normally used to compulsorily introduce external air into the interior of the video projector or discharge heated air from the interior, so as to cool the electronics and lamp in the interior of the video projector.

However, because the video projector is used quite near the user or video viewer(s), the video viewer(s) would be significantly disturbed by great noise produced by the ventilation operations. Further, heated air discharged from the interior of the video projector would greatly displease and disturb the video viewer(s). Therefore, it has been conventional to support the fan unit at a plurality of corners thereof by means of supporting members each made of a rubber or other resilient material, in order to absorb vibrations of the fan unit utilizing the resiliency of the supporting members. However, because characteristics of the rubber supporting members tend to be greatly varied by temperature changes, the resiliency of the supporting members would be weakened by the heated exhaust air so that the vibrations of the fan unit are undesirably transmitted to the outer case of the video projector. Further, with the fan unit thus supported at its corners, horizontal vibrations of the fan unit can not be sufficiently absorbed.

SUMMARY OF THE INVENTION

In view of the foregoing, it is an object of the present invention to provide a ventilating structure for an electronic apparatus which can minimize noise caused by the ventilation operations and allows a user to use the electronic apparatus without being disturbed by the ventilation operations.

It is another object of the present invention to provide a ventilating structure for a video projector which can reduce noise caused by the ventilation operations and allows a user to use the video projector without being disturbed by the ventilation operations.

It is still another object of the present invention to provide a mounting structure for a fan unit which can minimize transmission, to an outer case, of horizontal vibrations of the fan unit and thereby effectively reduce noise caused by the ventilation operations.

According to an aspect of the present invention, there is provided a ventilating structure for an electronic apparatus, which comprises an inner case that houses electronics, and an outer case that houses the inner case along with the electronics. The inner case and the outer case each have an intake opening, and in the area where the respective intake openings are provided, the inner case and the outer case are spaced from each other by a sufficient distance such that an intake chamber is defined between the inner case and the outer case.

In the ventilating structure, the intake opening of the inner case and the intake opening of the outer case are displaced from each other with respect to a front-and-rear direction of the electronic apparatus so as to provide a nonlinear intake passage in a rear end section of the electronic apparatus. The inner case is designed to also function as a shield case for the electronics. The electronic apparatus may be a video projector, in which case the intake openings are preferably provided near a rear end surface of the video projector.

With the arrangements that the inner and outer case together constitute a dual housing structure for the electronic apparatus and the intake chamber is defined in the area where the intake openings of the cases are provided, external air to be introduced into the electronic apparatus is temporarily stored in the intake chamber and then directed to the interior of the apparatus. Because the inventive arrangements can thus provide a wider air flow passage, air intake noise and noise caused by a motor/fan unit disposed in the interior can be effectively prevented from greatly leaking out of the electronic apparatus. Further, because the intake opening of the inner case and the intake opening of the outer case in the invention are displaced from each other with respect to the front-and-rear direction of the electronic apparatus (namely, the intake openings of the inner and outer cases are not in linear alignment along the front-and-rear direction of the electronic apparatus) so as to provide a nonlinear intake passage, the noise caused by the interior motor/fan unit can be prevented even more effectively from leaking out of the apparatus. Furthermore, with the inner case designed to also function as the shield case, leakage, from the electronic apparatus, of electromagnetic noise can also be prevented.

Generally, in many home theaters, people view the screen while sitting or standing behind the video projector; thus, in the present invention, the intake openings are provided near the rear end surface of the video projector with exhaust openings provided to open outwardly from a front end surface of the electronic apparatus, with a view to avoiding the exhaust air from blowing against the viewers behind the projector.

According to another aspect of the present invention, there is provided a video projector, which comprises: a projecting lens provided in a front end section of the video projector; a fan provided on one of left and right sides in the front end section for discharging exhaust air from within the video projector; a silencer provided on other of the left and right sides in the front end section, for silencing the exhaust air discharged via the fan; and a duct connecting between the fan and the silencer while bypassing an underside or upside of the projecting lens.

Preferably, in the portion of the duct which bypasses the projecting lens, the duct has a reduced height but an increased dimension in the front-end-direction of the video projector (i.e., width or depth) to make up for the reduced height in such a manner that the duct has a substantially uniform sectional area throughout its length. The duct may comprise a cover constituting a front portion thereof and a body constituting a rear portion thereof. Preferably, the body of the duct has a substantially flat rear surface and the cover has a width in the front-and-rear direction varying in corresponding relation to a variation in height of the cover so that the cover has a curved front surface. The silencer may have an intake port formed in a side surface thereof and an exhaust port formed in a front surface thereof, and the silencer may have an inner wall surface made of a sound absorbing material. The video projector may further comprise an inner case that houses a lamp and electronic circuitry and an outer case disposed outside the inner case. In this instance, the fan is connected to the inner case, and the fan, duct and silencer are each disposed between the inner case and the outer case.

With the arrangement that the fan and silencer are disposed to the left and right of the projecting lens and interconnected via the duct, the present invention can increase the overall length of the duct, i.e. an exhaust discharge section, and thus can reduce the noise caused by the discharge of the exhaust air. Further, because the duct bypasses the underside or upside of the projecting lens, namely, because the fan, silencer and duct are installed using the area where the lens is provided, it is possible to install these fan, silencer and duct without having to increase the dimension, in the front-and-rear direction, of the video projector. Further, because the exhaust air is discharged from the front end of the video projector, the present invention can avoid the exhaust air from blowing against the viewers behind the projector.

In the portion bypassing the projecting lens, the duct has a reduced height, but it has an increased width or depth to make up for the reduced height in such a manner that the duct has a substantially uniform sectional area throughout its length. This arrangement can avoid an increase in resistance to the air despite the variation in the sectional shape of the duct, and thus can prevent degradation of the exhaust discharge efficiency. Further, because the width variation of the duct is achieved by varying the shape of the duct's front surface, the rear surface of the duct can be made practically flat, so that the duct can be installed with ease.

Further, in the video projector of the present invention, the silencer takes in air via the intake port provided in its side surface and discharges the air via the exhaust port provided in its front surface. Namely, the silencer discharges the air after causing the air to impinge against the shock absorbing surface and deflect by 90 degrees, with the result that the exhaust discharge sound can be subdued even more effectively. Furthermore, because the lamp and electronic circuitry are housed in the inner case, the exhaust discharge section only has to discharge the air out of the inner case. Thus, the fan, duct and silencer can be installed outside the inner case, i.e. snugly between the outer case and the inner case, and thus the video projector can have an improved outer appearance.

According to still another aspect of the present invention, there is provided a structure for mounting a fan unit to a fan case, which comprises: gel-state shock absorbers; and at least three mounting portions formed on front and rear surfaces of the fan unit. Here, the at least three mounting portions are attached to the fan case via the gel-state shock absorbers. The mounting portions of the fan unit may comprise two pairs of front and rear mounting portions formed, in opposed relation to each other, on the front and rear surfaces of the fan unit, in which case the two pairs may be spaced apart from each other on an imaginary straight line passing a rotation shaft of a fan of the fan unit or the center of gravity of the fan unit.

In this invention, the fan unit is supported by being sandwiched at its front and rear surfaces, rather than at its corners. The gel-state shock absorbers are used as means for supporting the fan unit relative to the fan case. Because the gel-state shock absorbers have good thermal characteristics and extremely high vibration absorbing characteristics, vibrations of the fan unit can be prevented from being transmitted to the fan case, even in a situation where the fan discharges hot exhaust air and the gel-state shock absorbers are exposed to the hot discharge air. Further, because the fan unit is supported by being sandwiched at its front and rear surfaces, horizontal vibrations of the fan unit (e.g., those caused by an offset in the center of gravity of the fan) can be absorbed by deformation, in shearing directions, of the gel-state shock absorbers. As a result, the present invention can effectively avoid the problem that the vibrations of the fan unit are easily transmitted to the fan case, as compared to the case where the fan unit is supported at its corners.

BRIEF DESCRIPTION OF THE DRAWINGS

For better understanding of the object and other features of the present invention, its preferred embodiments will be described hereinbelow in greater detail with reference to the accompanying drawings, in which.

DETAILED DESCRIPTION OF THE PREFERRED EMBODIMENTS

The following will describe embodiments of the present invention, but it should be appreciated that the present invention is not limited to the described embodiments and various modifications of the invention are possible without departing from the basic principles. The scope of the present invention is therefore to be determined solely by the appended claims.

Figure 1:
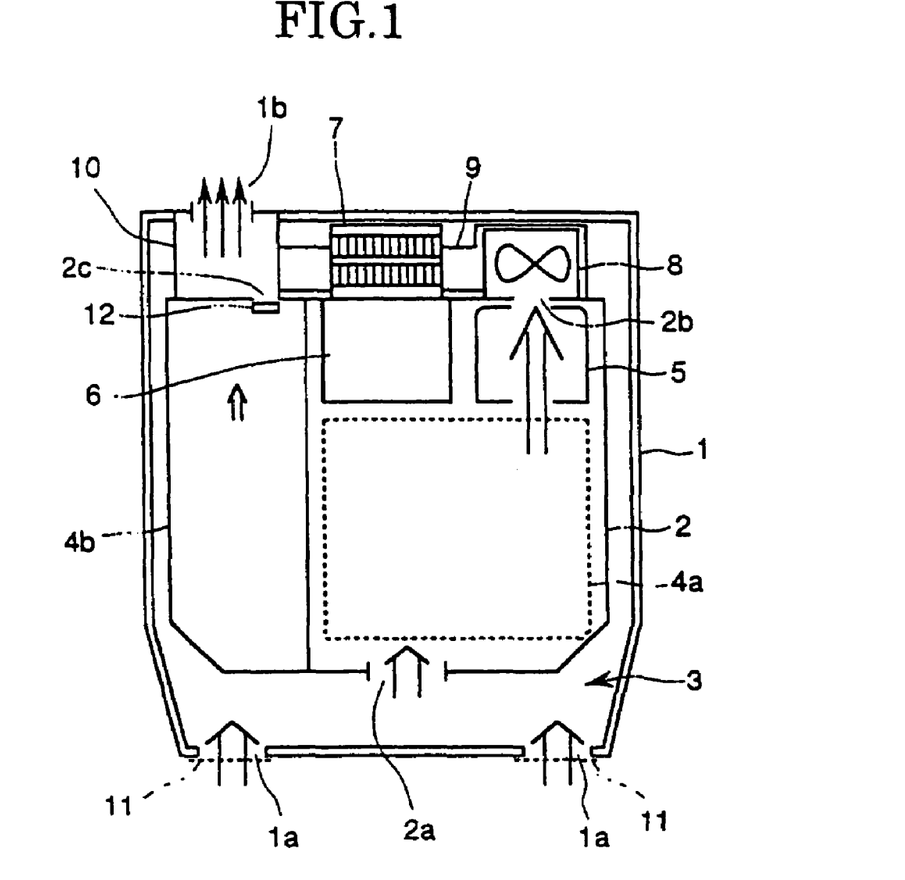
FIG. 1 is a plan view showing an inner structure of a video projector to which is applied an embodiment of the present invention.
Figure 2:
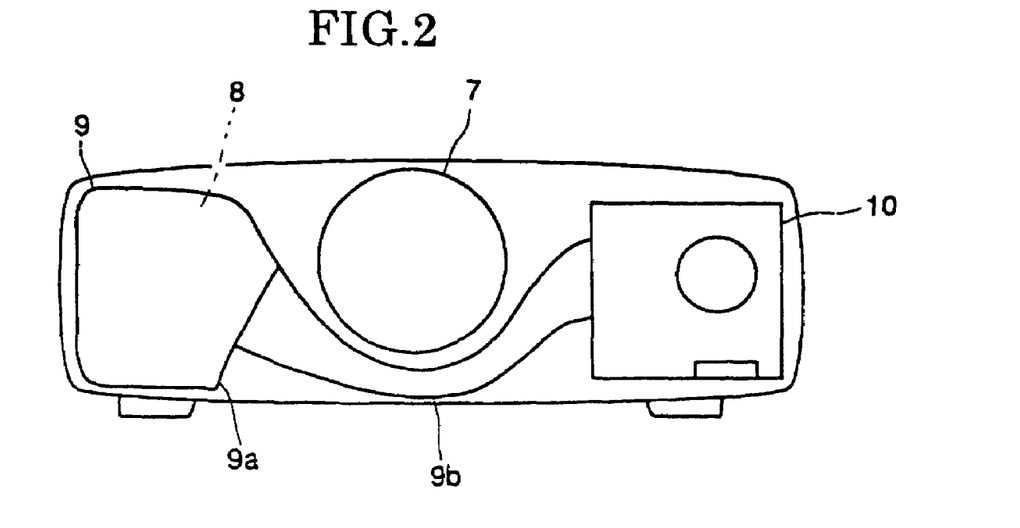
FIG. 2 is a front view of the video projector with its outer case removed.

FIG. 1 is a plan view showing an inner structure of a video projector to which is applied an embodiment of the present invention, and FIG. 2 is a front view of the video projector with its outer case removed. The outer case 1 of the video projector is formed of resin, and an inner case 1 designed to function as a shield case is made of aluminum 2 and disposed within the outer case 1. Further, within the aluminum-made inner case or shield case 2, there are provided an electronic circuit board 4, a light source lamp 5 and an image-reproducing optical unit 6. In the plan view of FIG. 1, a front end surface of the video projector is depicted as facing upward, and the image-reproducing optical unit 6 is provided on a middle front end section within the shield case 2. The mage-reproducing optical unit 6 is positioned outwardly of the front end of the shield case 2, i.e. between the shield case 2 and the outer case 1. Projecting lens 7 is disposed centrally in a front end section of the video projector between the outer and inner cases 1 and 2. The light source lamp 5 is disposed to the left of the mage-reproducing optical unit 6 as viewed from the front of the optical unit 6 or video projector; hereinafter, the terms "left" and "right" refer to left and right sides as viewed from the front of the video projector. The light source lamp 5 is an incandescent lamp which produces a relatively great amount of light with power consumption in the order of 150 watts. The image-reproducing optical unit 6 includes a mirror, a color filter, a DMD (trademark) which stands for a digital micro-mirror device functioning as a light switching mirror device, and the like. In the image-reproducing optical unit 6, the mirror directs lamp light, having a color selected via the color filter, to the DMD. The color filter is rotated by an electric motor so as to supply the three primary colors to the DMD on a time-divisional basis. The DMD comprises a group of minute mirror elements of 1024×768 pixels. Reflecting directions of the individual mirror elements are varied by image signals so that video images are reproduced by the individual mirrors. The video images reproduced on the DMD are projected via the projecting lens onto a screen.

The electronic circuit board 4 includes an image processing circuit board portion 4a and an input-signal processing circuit board portion 4b. The image processing circuit board portion 4a is disposed rearwardly of the image-reproducing optical unit 6 and lamp 5, and the input-signal processing circuit board portion 4b is disposed to the right of the shield case 2. Although not specifically shown, the video projector has, on its right side, input terminals for inputting various image signals to the input-signal processing circuit board portion 4b.

Two intake openings 1a are provided in a rear end wall portion of the outer case 1 adjacent rear left and right corners of the case 1, and a single exhaust opening 1b is provided in a front end wall portion of the outer case 1 adjacent a front right corner of the case 1. Further, a single intake opening 2a is provided substantially in the middle of a rear end wall portion of the shield case 2, and a single exhaust opening 2b is provided in a front end wall portion of the shield case 2 adjacent a front left corner of the case 2. The exhaust opening 2b of the shield case 2 is located immediately in front of the lamp 5 that generates the greatest amount of heat.

In the rear end section of the video projector where the intake openings 1a and 2a of the outer and inner cases 1 and 2 are provided, the outer case 1 and shield case 2 are spaced from each other by a sufficient distance such that an intake chamber 3 is defined between the rear end wall portions of the outer case 1 and shield case 2. The defined intake chamber 3 has a capacity which is larger than the balance of an air flow which is introduced from the intake openings 1a of the outer case 1 and an air flow which is taken from the intake openings 2a of the shield case 2. Therefore, velocity of flow in the intake chamber 3 is reduced and air stays in the intake chamber 3 to prevent direct flow from the intake openings 1a to the intake openings 2a. With the intake openings 1a provided at left and right locations with respect to the center in the rear end wall portion of the outer case 1 and the single intake opening 2a provided centrally in the rear end wall portion of the shield case 2, the intake openings 1a of the outer case 1 and the intake opening 2a of the shield case 2 are displaced from each other with respect to the front-and-rear direction of the video projector (i.e. out of linear alignment with each other along the front-and-rear direction) and are laterally offset from each other (left-and-right direction in the paper sheet) so as not to be acoustically connected with each other, so that noisy sounds caused by ventilation (ventilating sounds) within the outer case 1 can be effectively prevented from leaking through the backside of the video projector to the outside. The ventilating sounds include operating sounds of the electric fan, motor rotating the color filter and whizes caused by air flowing among various components within the video projector. Filter 11, which is in the form of a sponge or open-cell foam, is provided in each of the two intake openings 1a of the outer case 1.

As described, the video projector of the present invention is characterized in that it includes a dual housing structure composed of the outer case 1 and inner or shield case 2, the outer case 1 and shield case 2 are spaced apart from each other to define the intake chamber 3 and the intake openings 1a of the outer case 1 and the intake opening 2a of the shield case 2 are aligned in an offset manner with each other in the front-and-rear direction. Such characteristic arrangements can greatly contribute to reduction of the noisy sounds caused by the ventilation operations in the video projector. Specifically, with the arrangements, it is possible to reduce the noise leaking out through the intake openings by 2 dB.

In the front end section of the video projector, a motor/fan unit 8 for discharging exhaust air, duct 9 and silencer 10 are provided between the shield case 2 and the outer case 1. The motor/fan unit 8 is housed in a fan case portion 9a of the duct 9 and opposed to the exhaust opening 2b of the shield case 2. The motor/fan unit 8 includes a so-called sirocco fan 83 (see FIG. 4) that takes in external air through a side surface portion thereof and discharges the air in circumferential directions. More specifically, the motor/fan unit 8 takes in the air from within the shield case 2 and then discharges the taken-in air into a body portion 9b of the duct 9. Thus, the heat generated by the lamp 5 can be discharged via the duct 9 to the outside without flowing in the shield case 2. The duct body portion 9b is located in the front end section of the video projector between the outer case 1 and the shield case 2, and it interconnects the fan case portion 9a disposed on the left of the projector's front end section and the silencer 10 disposed on the right while bypassing the underside of the projecting lens 7. With the duct body portion 9b bypassing the projecting lens 7, the lens 7 is provided centrally in the front end section of the video projector and thus can be operated with increased ease. Further, because the duct 9 interconnecting the fan case portion 9a and silencer 10 disposed to the left and right of the lens 7 has an increased length, there can be attained an enhanced sound reducing effect. The silencer 10 causes the air flowing from the duct 9 to impinge against its sound absorbing inner surface and then discharges the air via its exhaust port, as will be later described. The exhaust opening 1b of the outer case 1 is in the form of a grille.

Also, a small fan 12 is provided for the input-signal processing circuit board portion 4b, and this fan 12 and the silencer 10 are connected in fluid communication with each other via a small exhaust hole 2c formed in the shield case 2.

Figure 3A:
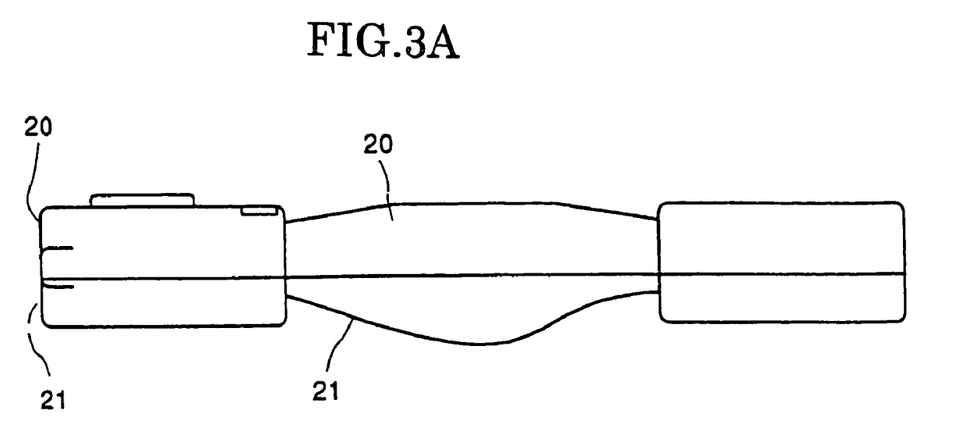
FIGS. 3A and 3B are a plan view and a front view, respectively, of a duct employed in the video projector, which particularly show the duct with a silencer attached thereto.
Figure 3B:
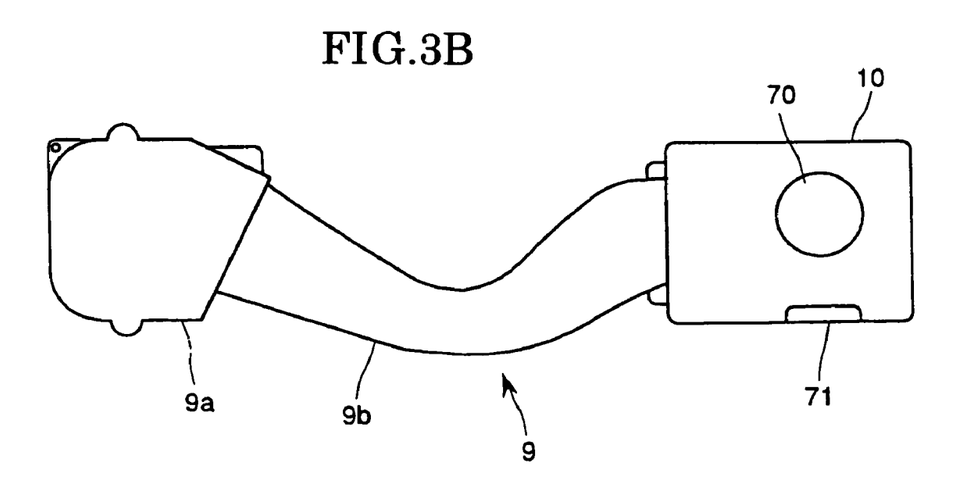

FIGS. 3A and 3B are a plan view and a front view, respectively, of the duct 9, which particularly show the duct 9 with the silencer 10 attached thereto. As shown, the duct 9 includes the fan case portion 9a and body portion 9b. The fan case portion 9a houses the motor/fan unit 8 provided with the sirocco fan and has an opening formed in a backside thereof adjacent the shield case 2. The duct 9 takes in the air from within the shield case 2 via the backside opening, and directs the taken-in air to the body portion 9b. The body portion 9b interconnects the fan case portion 9a and silencer 10 while bypassing the underside of the projecting lens 7. In the portion of the duct body portion 9b which bypasses the projecting lens 7, the body portion 9b has a reduced height but an increased depth (dimension in the front-and-rear direction of the video projector) to make up for the reduced height, in such a manner that the body portion 9b has a substantially uniform sectional area throughout its length.

In the plan view of FIG. 3A, the duct 9 is shown as composed of a body 20 constituting a rear surface of the duct 9 and a cover 21 constituting a front surface of the duct 9. The rear surface of the body 20 is made up of three flat surfaces, the middle one of which lies flush with the rear surface of the fan case section 9a. This flat rear surface feature allows the duct 9 to be easily attached to the shield case 2. The cover 21 of the duct 9 bulges rearwardly to have a greater width in and around a center thereof, so as to make up for the reduced height. The depth or width (dimension in the front-and-rear direction of the video projector) of the cover 21 increases according as the height of the duct 9 decreases. Thus, when the body 20 and cover 21 are assembled together, the duct body portion 9b has a substantially uniform sectional area throughout its length. Because the sectional area does not vary despite a variation in the sectional shape of the duct body portion 9b, the air discharged from the duct 9 presents no variation in pressure and hence does not exhibit great resistance to fluid. Further, most of the variation in width of the duct 9 is provided by curving the surface of the cover 21, the rear surface of the body 20 can be made flat, which facilitates attachment of the duct 9 to the shield case 2.

Figure 4A:
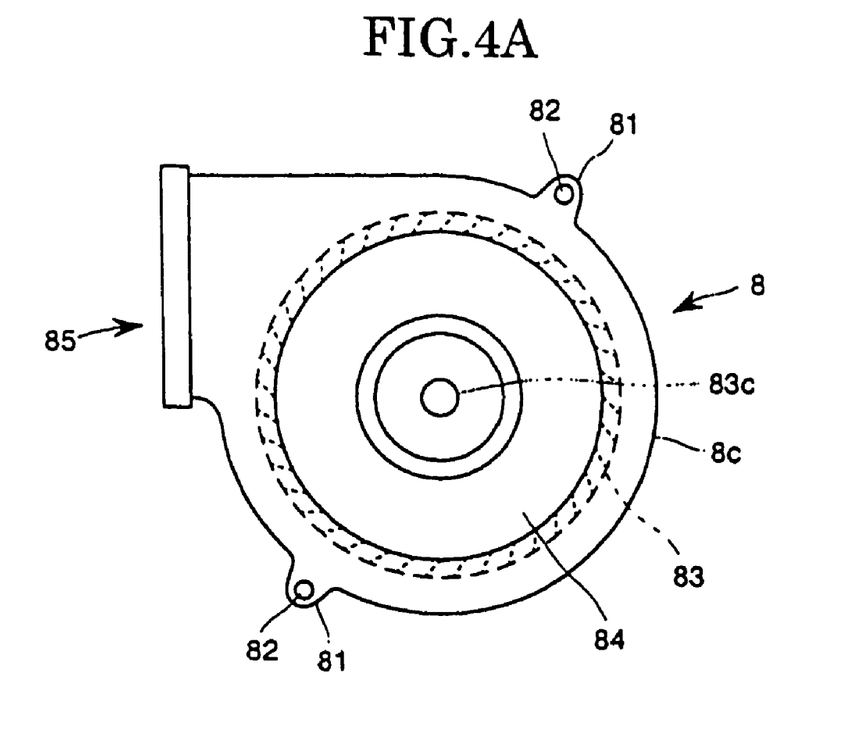
FIGS. 4A and 4B are a front view and a rear view, respectively, of a motor/fan unit received in the duct.
Figure 4B:
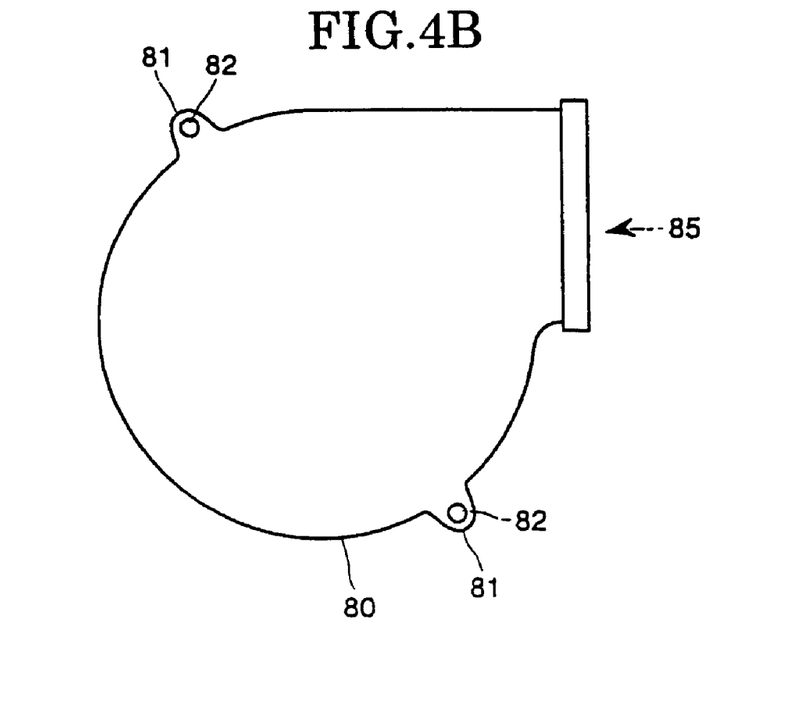

FIGS. 4A and 4B are a front view and a rear view, respectively, of the motor/fan unit 8. The motor/fan unit 8 is mounted within the fan case portion 9a in such an orientation where the front surface of FIG. 4A faces the exhaust opening 2b of the shield case 2. This motor/fan unit 8 includes the sirocco fan 83 driven by an electric motor (not shown) and a casing 80 shaped like a spiral shell. The casing 80 has a circular intake port 84 in its front wall portion and an exhaust port 85 in its side wall portion. The sirocco fan 83 is provided to turn along the circumference of the intake port 84. The casing 80 also has two pairs of front and rear mounting portions 81 each in the form of a radial projection, and each of the mounting portions 81 has a screw hole 82. Specifically, the pairs are angularly spaced apart from each other, and in each of the pairs, the front and rear mounting portions 81 are aligned with (opposed to) each other in the front-and-rear direction of the video projector; that is, the pairs are spaced apart from each other on an imaginary straight line passing the rotation shaft of the fan of the fan unit or the center of gravity of the fan unit. The two angularly-spaced-apart front mounting portions 81 are provided on the front surface of the casing 80, while the two angularly-spaced-apart rear mounting portions 81 are provided on the rear surface of the casing 80. The two mounting portions 81 are symmetrical to each other with respect to the rotation shaft 83c of the sirocco fan 83, and these mounting portions 81 function to prevent undesired vibrations of the sirocco fan 83 during the rotation.

Note that the motor/fan unit 8 in this video projector is fixed to the fan case 9a via a gel-state shock absorber 19 (FIG. 5) affixed to the outer surface of each of the mounting portions across the screw hole 82, rather than via a screw threaded through each of the screw holes 82. The gel-state shock absorbers may each be Solbosein (trademark) or the like.

Figure 5A:
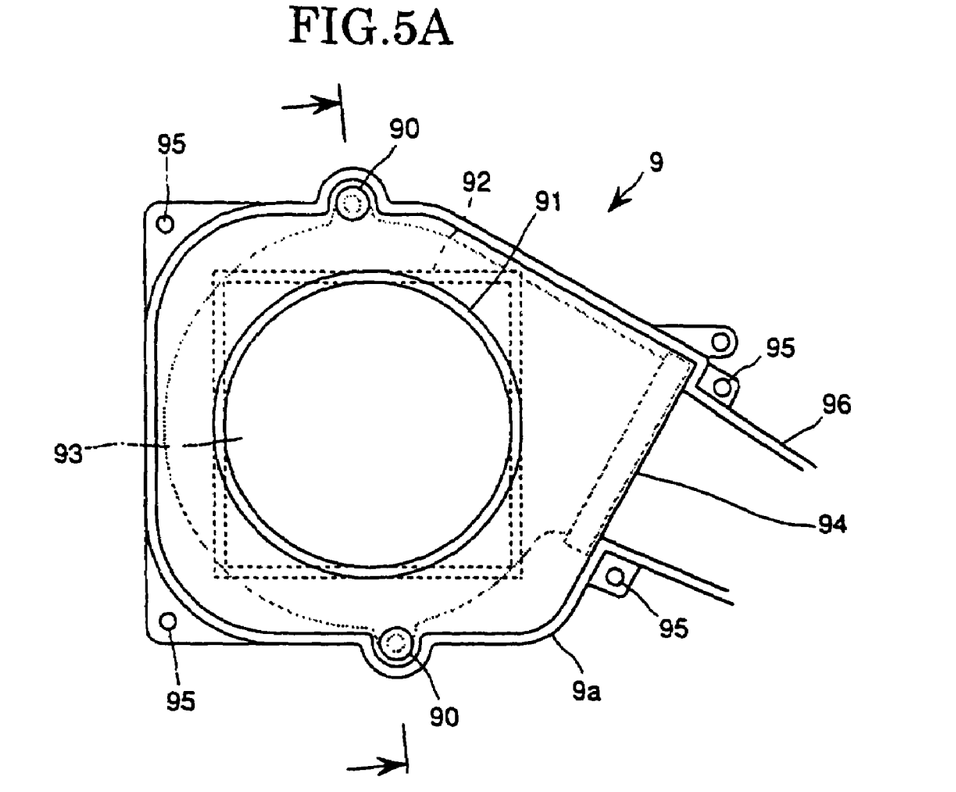
FIGS. 5A–5C are views showing an inner structure of a fan case portion of the duct.
Figure 5B:
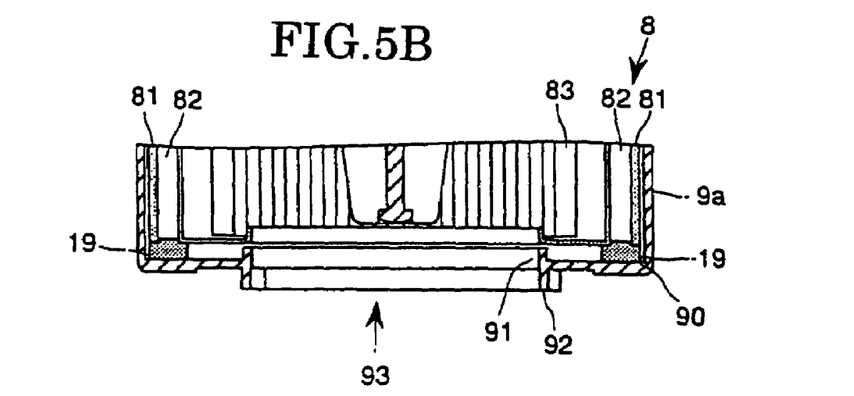
Figure 5C:
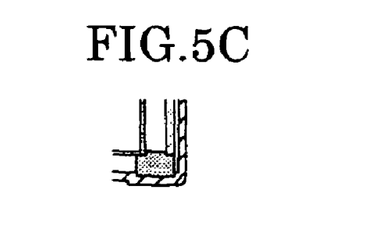

FIGS. 5A–5C show the interior of the fan case portion 9a in the body 20 of the duct 9. The fan case portion 9a has an opening 93 formed in its wall surface in alignment with the intake port 84 formed in the casing 80 of the motor/fan unit 8. Ring-shaped rib 91 is formed along the periphery of the opening 93 to fill a gap between the fan unit 8 and the fan case portion 9a. Note that this rib 91 is positioned out of contact with the casing 80 of the motor/fan unit 8. Further, a rectangular rib 92 is formed around the opening 93, which fits into the exhaust opening 2b of the shield case 2. The exhaust port 85 of the motor/fan unit 8 received in the fan case portion 9a is positioned in alignment with a connection 94 between the fan case portion 9a and the duct body portion 9b. In the connection 94, the motor/fan unit 8 and fan case portion 9a are in close proximity to (but not in contact with) each other and the duct body portion 9b has the same inside dimensions as the exhaust port 85 of the motor/fan unit 8, so that the exhaust of the motor/fan unit 8 can be discharged to the duct body portion 9b with almost no leakage.

As shown in a sectional view of FIG. 5B, the motor/fan unit 8 is supported via the gel-state shock absorbers 19 affixed between the mounting portions 82 of the unit 8 and supporting regions of the fan case portion 9a. The motor/fan unit 8 does not contact the fan case portion 9a even in its regions where the intake port 84 and exhaust port 85 are formed. Thus, vibrations of the motor/fan unit 8 due to the rotation of the fan can be effectively absorbed by the gel-state shock absorbers 19 and hence can be prevented from being transmitted to the duct 9 and shield case 2. As a consequence, noisy sounds produced by the ventilating fan can be reduced to a significant degree.

Because the gel-state shock absorbers 19 are adhesive by themselves, they can be sufficiently affixed to the mounting portions 81 of the motor/fan unit 8 (casing 80) and the fan case portion 9a by just being pressed against the mounting portions 81 and the inner surface of the fan case portion 9a, and horizontal vibrations of the motor/fan unit 8 can be absorbed by deformation, in shearing directions, of the gel-state shock absorbers 19.

As shown in FIG. 5C, each of the supporting regions of the fan case portion 9a is preferably in the form of a recess 90. In this case, the inner surface of each of the disk-shaped gel-state shock absorbers 19 has a central region bulging inwardly to fit into the screw hole 82 of the corresponding mounting portion 81, and the outer surface of each of the disk-shaped gel-state shock absorbers 19 fits into the corresponding recess 90 of the fan case portion 9a. This arrangement can prevent the horizontal vibrations of the motor/fan unit 8 even more effectively.

Figure 6:
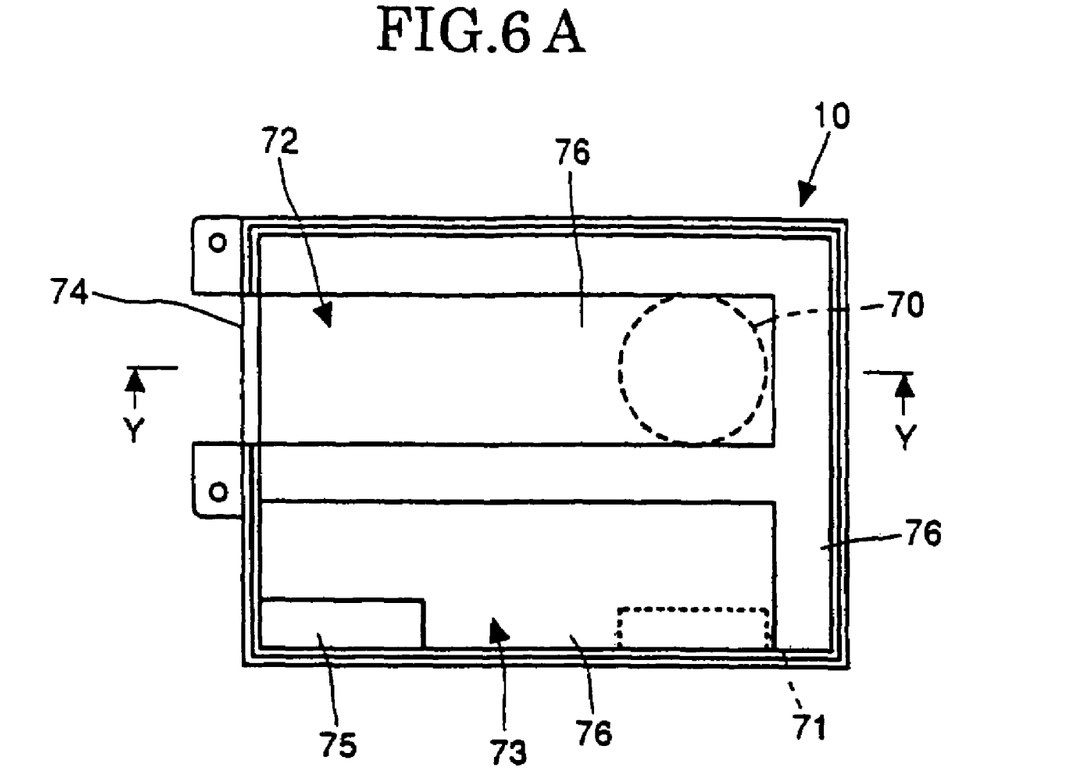
FIGS. 6A and 6B are views showing an inner structure of a silencer employed in the video projector.

FIGS. 6A and 6B show an inner structure of the silencer 10. FIG. 6A is a front view of the silencer 10 with a silencer cover removed to show the interior of the silencer 10. The interior of the silencer 10 is divided into two chambers, upper silencing chamber 72 and lower silencing chamber 73. The upper silencing chamber 72 has an intake port 74, via which the chamber 72 is connected to the duct 9. The lower silencing chamber 73 has an intake port 75, via which the chamber 73 is connected to the small exhaust hole 2c that is provided for the input-signal processing circuit board portion 4b. As seen from FIGS. 2 and 3, exhaust ports 70 and 71 of the upper silencing chamber 72 and lower silencing chamber 73 are formed in the cover of the silencer 10: The inner surface of the silencer 10 is covered with a sound absorbing material 76 such as urethane sponge. The intake port 74 and exhaust port 70 of the upper silencing chamber 72 are interconnected by a passage bent 90 degrees, so that the air flowing in from the duct 9 impinges against the absorbing material 76 on the inner surface of the chamber 72 to be deflected toward the exhaust port 70 and is then discharged via the exhaust port 70. Further, the intake port 75 and exhaust port 71 of the lower silencing chamber 73 are interconnected by a passage bent into a crank-like shape, so that the air flowing in from the duct 9 impinges against the absorbing material 76 of the chamber 73 to be deflected twice toward the exhaust port 71 and is then discharged via the exhaust port 71. Because the exhaust air from the duct 9 is discharged after impinging against the absorbing material 76 and being deflected by the impingement as set forth above, noise caused by the ventilating fan and other ventilation operations can be significantly lessened.

Whereas the image-reproducing optical unit 6 in the embodiment has been described as employing the DMD (digital micro-mirror device), the DMD may be replaced with another suitable device such as a liquid crystal display (LCD) device.

Further, whereas the embodiment has been described as applied to the video projector, the ventilating mechanism and silencing mechanism disclosed herein may be applied to any other electronic apparatus, such as a printer and a personal computer.

Further, the duct 9 may be positioned in such a manner that the duct body portion 9a bypasses the upside, rather than the underside, of the projecting lens 7.

Furthermore, in the above-described embodiment, two pairs of the front and rear mounting portions 81 are provided on the front and rear surfaces of the motor/fan unit 8 —two angularly-spaced-apart mounting portions 81 on each of the surfaces— utilizing the screw holes of the unit 8. However, the present invention is not so limited; for example, the motor/fan unit 8 may have three such front and rear mounting portions 81 that are angularly spaced apart from each other so that the motor/fan unit 8 can be supported with increased stability. In such a case, the motor/fan unit 8 may be supported by at least two mounting portions 81 provided on one of the surfaces (front or rear surface) and one mounting portions 81 provided on the other surface (rear or front surface).

In summary, the present invention is characterized by the dual housing structure composed of the outer and shield (inner) cases and the provision of the intake chamber between the outer and inner or shield cases. With such arrangements, the present invention can minimize noise leaking out of the apparatus to the outside while performing a sufficient cooling function.

Further, with the arrangement that the fan and silencer are disposed to the left and right of the projecting lens and interconnected via the duct in the front end section of the electronic apparatus, the present invention can increase the length of the exhaust discharge section and thus reduce the noise caused by the fan. Because the duct bypasses the underside or upside of the projecting lens, it is possible to avoid an increase in overall size of the electronic apparatus. Further, with the arrangement that the fan unit is supported at its front and rear surfaces by the gel-state shock absorbers, the present invention can prevent the vibrations caused by the rotation of the fan from being transmitted to the fan case to cause noise.

What is claimed is:

1. A structure for mounting a fan unit to a fan case, said mounting structure comprising:
   at least one gel-state shock absorber; and
   a plurality of mounting portions formed on a front surface and a rear surface of said fan unit, said plurality of mounting portions being attached to the fan case via said at least one gel-state shock absorber, wherein
      the plurality of mounting portions of said fan unit include a pair of front mounting portions and a pair of rear mounting portions wherein each mounting portion of the pair of front mounting portions is formed in opposed relation to each other and each mounting portion of the pair of rear mounting portions is formed in opposed relation to each other, and the pair of front mounting portions and the pair of rear mounting portions are spaced apart from each other on an imaginary straight line passing a rotation shaft of a fan of said fan unit.

2. A structure for mounting a fan unit to a fan case, said mounting structure comprising:
   at least one gel-state shock absorber; and
   a plurality of mounting portions formed on a front surface and a rear surface of said fan unit, said plurality of mounting portions being attached to the fan case via said at least one gel-state shock absorber, wherein
      the plurality of mounting portions of said fan unit includes a pair of front mounting portions and a pair of rear mounting portions formed, in opposed relation to each other, on the front and rear surfaces of said fan unit, and wherein the pair of front mounting portions and the pair of rear mounting portions are spaced apart from each other on an imaginary straight line passing the center of gravity of said fan unit.

3. A structure for mounting a fan unit to a fan case, said mounting structure comprising:
   at least one gel-state shock absorber; and
   a plurality of mounting portions formed on a front surface and a rear surface of said fan unit, wherein each mounting portion of the plurality of mounting portions is configured with a screw hole and is attached to the fan case via said at least one gel-state shock absorber.

4. The structure of claim 3, wherein the at least one gel-state shock absorber is configured to fit within the screw hole of each mounting portion of the plurality of mounting portions to reduce horizontal vibration.

* * * * *